United States Patent
Van Der Laan

(10) Patent No.: US 6,787,789 B2
(45) Date of Patent: Sep. 7, 2004

(54) METHOD OF MEASURING ABERRATION OF A PROJECTION SYSTEM OF A LITHOGRAPHIC APPARATUS, DEVICE MANUFACTURING METHOD, AND DEVICE MANUFACTURED THEREBY

(75) Inventor: Hans Van Der Laan, Veldhoven (NL)

(73) Assignee: ASML Netherlands B.V. (NL)

( * ) Notice: Subject to any disclaimer, the term of this patent is extended or adjusted under 35 U.S.C. 154(b) by 140 days.

(21) Appl. No.: 10/225,458

(22) Filed: Aug. 22, 2002

(65) Prior Publication Data

US 2003/0047694 A1 Mar. 13, 2003

(30) Foreign Application Priority Data

Aug. 23, 2001 (EP) .............................. 01203188

(51) Int. Cl.⁷ .................. G03B 27/42; G01N 21/26
(52) U.S. Cl. .................. 250/548; 355/53; 430/5
(58) Field of Search .................. 250/548, 557, 250/559.3; 355/52, 53, 55, 77; 356/399–401; 430/5, 30, 311, 312

(56) References Cited

U.S. PATENT DOCUMENTS 5,424,552 A 6/1995 Tsuji et al.

| | | | |
|---|---|---|---|
| 6,118,535 A | 9/2000 | Goldberg et al. | |
| 6,613,483 B2 * | 9/2003 | Fujimoto | 430/5 |
| 2003/0174297 A1 * | 9/2003 | Chiba et al. | 355/52 |

FOREIGN PATENT DOCUMENTS

EP  1 063 570 A2  12/2000

OTHER PUBLICATIONS

A copy of the European Search Report dated Mar. 20, 2002, Issued in the corresponding European Application No. EP 01 20 3188.

* cited by examiner

Primary Examiner—Kevin Pyo
(74) Attorney, Agent, or Firm—Pillsbury Winthrop LLP

(57) ABSTRACT

A method of determining aberration of a projection system according to one embodiment of the invention includes using a test pattern to pattern a projection beam of radiation, using the projection system to project the patterned beam, and directly measuring an aerial image of the test pattern as formed by the projection system. The test pattern includes a two-dimensional lattice comprising a plurality of unit cells, each unit cell including at least three isolated areas. At least one of a transmissivity, a reflectivity, and a phase-shifting property of the isolated areas is substantially different from that of a remainder of the area of the unit cell.

22 Claims, 8 Drawing Sheets

Fig. 7.

| 1 | 2 | 3 | 4 | 5 |
|---|---|---|---|---|
| Z5 | $r^2 \cos 2\theta$ | third order | x astigmatism | hc x,y |
| Z6 | $r^2 \sin 2\theta$ | third order | 45° astigmatism | |
| Z7 | $(3r^3 - 2r)\cos\theta$ | third order | x coma | hc x |
| Z8 | $(3r^3 - 2r)\sin\theta$ | third order | y coma | hc y |
| Z9 | $6r^4 - 6r^2 + 1$ | third order | spherical aberration | hc x,y |
| Z10 | $r^3 \cos 3\theta$ | fifth order | x three-wave aberration | hc x |
| Z11 | $r^3 \sin 3\theta$ | fifth order | y three-wave aberration | hc y |
| Z12 | $(4r^4 - 3r^2)\cos 2\theta$ | fifth oredr | x astigmatism | hc x,y |
| Z13 | $(4r^4 - 3r^2)\sin 2\theta$ | fifth order | 45° astigmatism | |
| Z14 | $(10r^5 - 12r^3 + 3r)\cos\theta$ | fifth order | x coma | hc x |
| Z15 | $(10r^5 - 12r^3 + 3r)\sin\theta$ | fifth order | y coma | hc y |
| Z16 | $20r^6 - 30r^4 + 12r^2 - 1$ | fifth order | spherical aberration | hc x,y |
| Z17 | $r^4 \cos 4\theta$ | seventh order | x four-wave aberration | hc x |
| Z18 | $r^4 \sin 4\theta$ | seventh order | y four-wave aberration | hc y |
| Z19 | $(5r^5 - 4r^3)\cos 3\theta$ | seventh order | x three-wave aberration | hc x |
| Z20 | $(5r^5 - 4r^3)\sin 3\theta$ | seventh order | y three-wave aberration | hc y |
| Z21 | $(15r^6 - 20r^4 + 6r^2)\cos 2\theta$ | seventh order | x astigmatism | hc x,y |
| Z22 | $(15r^6 - 20r^4 + 6r^2)\sin 2\theta$ | seventh order | 45° astigmatism | |
| Z23 | $(35r^7 - 60r^5 + 30r^3 - 4r)\cos\theta$ | seventh order | x coma | hc x |
| Z24 | $(35r^7 - 60r^5 + 30r^3 - 4r)\sin\theta$ | seventh order | y coma | hc y |
| Z25 | $70r^8 - 140r^6 + 90r^4 - 20r^2 + 1$ | seventh order | spherical aberration | hc x,y |

METHOD OF MEASURING ABERRATION OF A PROJECTION SYSTEM OF A LITHOGRAPHIC APPARATUS, DEVICE MANUFACTURING METHOD, AND DEVICE MANUFACTURED THEREBY

This application claims priority to European Patent Application EP 01203188.6 filed Aug. 23, 2001, which document is herein incorporated by reference.

FIELD OF THE INVENTION

The present invention relates to lithographic projection apparatus and methods.

BACKGROUND

The term "patterning structure" as here employed should be broadly interpreted as referring to any structure or field that may be used to endow an incoming radiation beam with a patterned cross-section, corresponding to a pattern that is to be created in a target portion of a substrate; the term "light valve" can also be used in this context. Generally, such a pattern will correspond to a particular functional layer in a device being created in the target portion, such as an integrated circuit or other device (see below). Examples of such patterning structure include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of very small (possibly microscopic) mirrors, each of which can be individually tilted about an axis by applying a suitable localized electric field, or by employing piezoelectric actuation means. For example, the mirrors may be matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described hereabove, the patterning structure can comprise one or more programmable mirror arrays. More information on mirror arrays as here referred to can be gleaned, for example, from U.S. Pat. No. 5,296,891 and No. 5,523,193, which are incorporated herein by reference, and PCT patent applications WO 98/38597 and WO 98/33096, which are incorporated herein by reference. In the case of a programmable mirror array, the said support structure may be embodied as a frame or table, for example, which may be fixed or movable as required.

A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning structure as hereabove set forth.

Lithographic projection apparatus can be used, for example, in the manufacture of integrated circuits (ICs). In such a case, the patterning structure may generate a circuit pattern corresponding to an individual layer of the IC, and this pattern can be imaged onto a target portion (e.g. comprising one or more dies) on a substrate (e.g. a wafer of silicon or other semiconductor material) that has been coated with a layer of radiation-sensitive material (resist). In general, a single wafer will contain a whole network of adjacent target portions that are successively irradiated via the projection system (e.g. one at a time).

Among current apparatus that employ patterning by a mask on a mask table, a distinction can be made between two different types of machine. In one type of lithographic projection apparatus, each target portion is irradiated by exposing the entire mask pattern onto the target portion at once. Such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally<1), the speed V at which the substrate table is scanned will be a factor M times that at which the mask table is scanned. A projection beam in a scanning type of apparatus may have the form of a slit with a slit width in the scanning direction. More information with regard to lithographic devices as here described can be gleaned, for example, from U.S. Pat. No. 6,046,792, which is incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake, and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

The term "projection system" should be broadly interpreted as encompassing various types of projection system, including refractive optics, reflective optics, and catadioptric systems, for example. For the sake of simplicity, the projection system may hereinafter be referred to as the "lens". The radiation system as well as the projection system may include components operating according to any of these design types for directing, shaping, reducing, enlarging, patterning, and/or otherwise controlling the projection beam of radiation, and such components may also be referred to below, collectively or singularly, as a "lens". In particular, the projection system will generally comprise means to set the numerical aperture (commonly referred to as the "NA") of the projection system, and the radiation system typically comprises adjusting means for setting the outer and/or inner radial extent (commonly referred to as σ-outer and σ-inner, respectively) of the intensity distribution upstream of the patterning means (in a pupil of the radiation system).

Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and PCT Application No. WO 98/40791, which documents are incorporated herein by reference Generally, in order to realize integration of an increasing number of electronic components in an IC, it is necessary to increase the surface area of an IC and/or to decrease the size of the components. For the projection system, it is desirable in particular to increase the resolution so that increasingly smaller details, or line widths, can be imaged in a well-defined way onto a target portion. Such a projection system must comply with very stringent quality requirements.

A projection system may exhibit residual aberration. In practice, the projection system is not an ideal (diffraction-limited) system; generally the projection system is an aberration-limited system. Such aberration may be due, for example, to manufacturing tolerances and generic lens design limitations. Residual aberration may comprise low-order aberrations (e.g. third-order distortion, third-order x astigmatism, third-order 45° astigmatism, third-order x coma, third-order y coma and third order spherical aberration) as well as higher-order aberrations (e.g. fifth-order and seventh-order distortion, x and 45° astigmatism, x and y coma, and x and y three-wave aberration). For more information about aberrations mentioned above, see, for example, the paper entitled "Towards a comprehensive control of full-field image quality in optical photolithography", authored by D. Flagello et al., *Proc. SPIE* 3051, pp. 672–685, 1997, which document is incorporated herein by reference.

The influence of residual aberration becomes increasingly significant with the application of newer techniques, such as phase-shift masks or off-axis illumination, to enhance the resolving power of a lithographic projection apparatus. Moreover, the low- and higher-order aberrations are not constant in time. Such variation may be due, for example, to changing environmental conditions, reversible changes as caused by lens heating, and/or ageing of components of the projection system as caused by interaction of the radiation of the projection beam with the material of said components. In order to minimize the residual aberration (e.g. intermittently during a manufacturing process), modern projection lithography apparatus generally comprise means to measure low-order and/or higher-order aberrations contributing to said residual aberration, means to adjust said aberrations (e.g. through adjustments of the position of one or more movable lens elements of the projection system, or of the support structure), and means to calculate and apply the required adjustments. For a description of a method to substantially minimize residual aberration, see, for example, European Patent Application 01303036.6, which document is incorporated herein by reference.

International Patent Application WO 00/31592, which document is incorporated herein by reference, discloses methodology for the determination of aberration in an optical projection system. In particular, this WO application describes the Aberration Ring Test ("ART"). This technique employs a series of ring-like features on a special test reticle, which are imaged through an optical projection system onto a photosensitive substrate. The images of the ring-like features on the substrate are then inspected, using a technique such as SEM (scanning electron microscopy). A comparison of the measured images with the corresponding original features on the reticle may reveal the type(s) of aberration that the optical projection system has introduced into the images.

The same WO application also describes a refinement of the ART technique known as ARTEMIS (ART Extended to Multiple Illumination Settings). This refinement makes use of the fact that each kind of aberration can be mathematically expressed as a specific Fourier harmonic that is a combination of a number of so-called Zernike polynomials, each with an associated Zernike aberration coefficient and weighting factor. In order to determine a number N of such Zernike aberration coefficients, the ART technique is performed at a plurality N of different groups of settings of σ-outer, σ-inner and NA. For simplicity, a group of settings of σ-outer, σ-inner and NA will be referred to hereinafter as a σ-NA setting. In this way, one is able to measure the same Fourier harmonic for each of the plurality N of σ-NA settings. Using a simulation program, reference values can be obtained for the above-mentioned weighting factors. In combination, this technique allows the desired set of Zernike aberration coefficients to be calculated, thus allowing quantification of the aberration concerned.

An alternative method to measure aberrations of a lithographic projection system is described in European Patent Application 01301571.4, which document is incorporated herein by reference. It concerns an in situ measurement of aberrations that is performed fast enough such as to not substantially impair the number of substrates that can be processed per unit of time. According to this method, the projection beam is patterned into a desired test pattern, and the intensity distribution of the projected aerial image of the test pattern is detected in situ using detection means incorporated in the substrate table. The position of best-focus (along the optical axis of the projection system) as well as the lateral position (in mutually orthogonal directions perpendicular to the optical axis of the projection system) of the projected aerial image of the test pattern are measured for a plurality of different σ-NA settings. Based on the results of said best focus and lateral position measurements, coefficients representative of one or more aberrations of the projection system may be calculated. The method is referred to hereinafter by TAMIS (Transmission image sensing At Multiple Illumination Settings).

The test pattern is typically a segment of a periodic grating comprising lines and spaces (respectively substantially blocking and transmitting projection beam radiation), for example. Segments of such gratings wherein the width of the spaces is large compared to the width of the lines may also be used as test patterns. Typically, two test patterns with the lines and spaces arranged parallel to two corresponding, mutually orthogonal, directions (in the plane comprising the pattern) are used to enable measurement of aberrations such as, for example, x coma and y coma.

However, in spite of such measures, the intensity distribution of projected aerial images of any such grating segments may not yield substantially detectable information on the presence of specific higher-order aberrations such as, for example, three-wave aberration. Consequently, there is the problem of providing test patterns suitable for reliably indicating and measuring the presence and magnitude of both low-order and higher-order aberrations, where the measurement can be done in situ such as to not substantially impair the number of substrates that can be processed per unit of time.

SUMMARY

Embodiments of the invention include a method of measuring aberration with improved sensitivity.

A method of determining aberration of a projection system according to one embodiment of the invention includes supplying a projection beam of radiation, using a test pattern to pattern the projection beam, and using the projection system to project the patterned beam. Such a method also includes directly measuring an aerial image of the test pattern as formed by the projection system to obtain a corresponding value of each of at least one parameter.

Based on the at least one corresponding value, at least one coefficient relating to aberration of the projection system is calculated. In this case, the test pattern includes a two-dimensional lattice comprising a plurality of unit cells, each unit cell including at least three isolated areas. At least one of a transmissivity, a reflectivity, and a phase-shifting property of the isolated areas is substantially different from that of a remainder of the area of the unit cell.

In particular applications of such a method, each unit cell may have a triangular, quadrangular, or hexagonal shape. In these or other applications, the direct measurement may be performed at each of a plurality of different illumination settings (i.e. different numerical aperture settings; different settings of the outer and/or inner extent of the intensity distribution of the projection beam; different illumination modes such as disc-shaped, annular, and quadrupolar; etc.). The direct measurement may also be performed using radiation detection means including a plurality of radiation apertures.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer", or "die" in this text should be considered as being replaced by the more general terms "mask", "substrate", and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm).

BRIEF DESCRIPTION OF THE DRAWINGS

Embodiments of the invention will now be described, by way of example only, with reference to the accompanying schematic drawings in which:

FIG. 7 lists a table of Zernike coefficients and polynomials.

DETAILED DESCRIPTION

Figure 1:
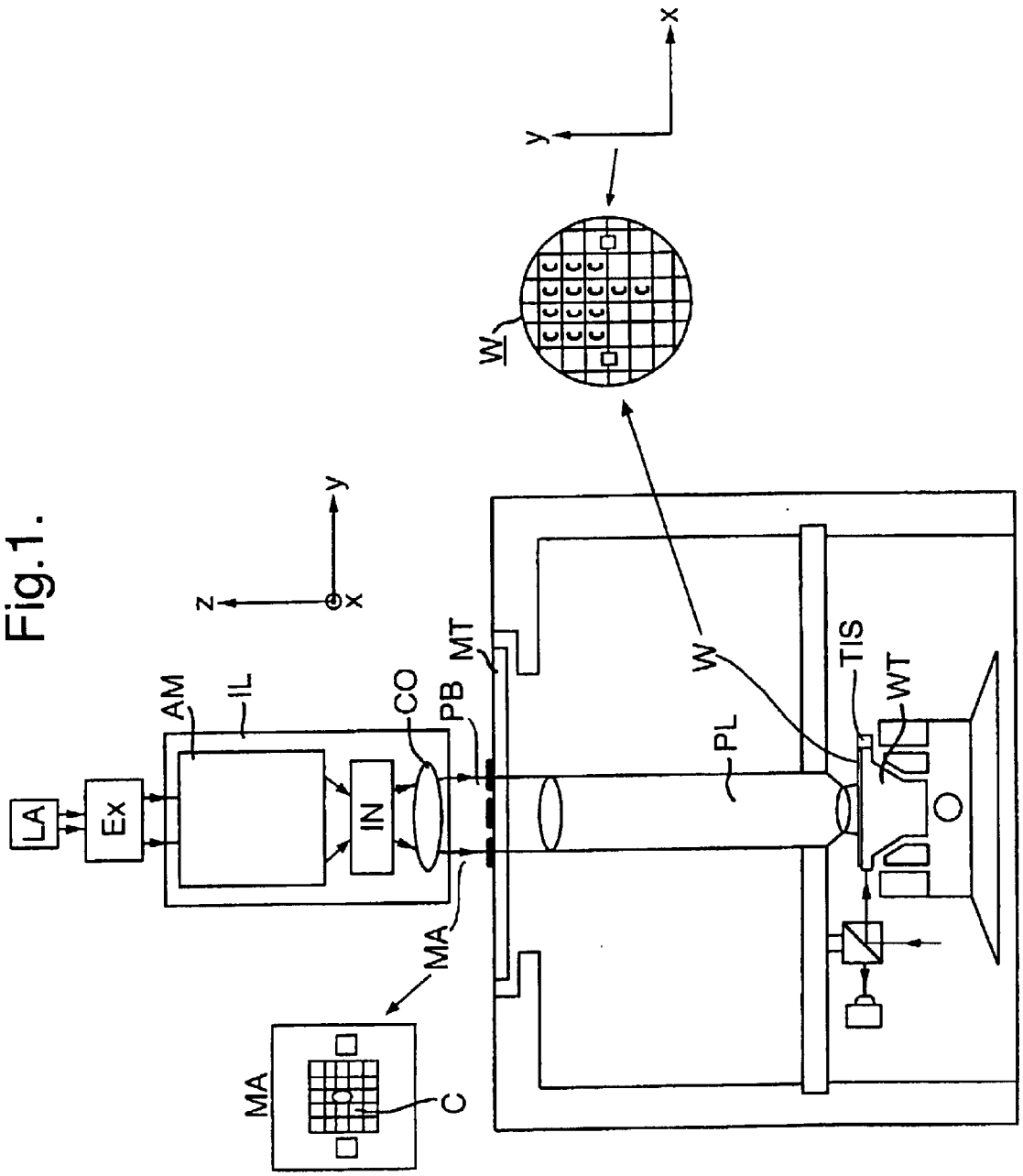
FIG. 1 depicts a lithographic projection apparatus according to an embodiment of the invention.

FIG. 1 schematically depicts a lithographic projection apparatus according to a particular embodiment of the invention. The apparatus comprises:

A radiation system configured to supply (e.g. having structure capable of supplying) a projection beam of radiation. In this particular example, the radiation system Ex, IL, for supplying a projection beam PB of radiation (e.g. UV radiation, or radiation with wavelengths within spectral wavelength ranges substantially centered at 248 nm, 193 nm, 157 nm, 126 nm, or 13.5 nm) also comprises a radiation source LA;

A support structure configured to support a patterning structure capable of patterning the projection beam. In this example, a first object table (mask table) MT is provided with a mask holder for holding a mask MA (e.g. a reticle), and is connected to a first positioning structure for accurately positioning the mask with respect to item PL;

A second object table (substrate table) configured to hold a substrate. In this example, substrate table WT is provided with a substrate holder for holding a substrate W (e.g. a resist-coated silicon wafer), and is connected to a second positioning structure for accurately positioning the substrate with respect to item PL; and A projection system ("lens") configured to project the patterned beam. In this example, projection system PL (e.g. a lens group that may include lenses made of quartz and/or $CaF_2$, a catadioptric or catoptric system that may include lens elements made of such materials, and/or a mirror system) is configured to image an irradiated portion of the mask MA onto a target portion C (e.g. comprising one or more dies) of the substrate W.

As here depicted, the apparatus is of a transmissive type (i.e. has a transmissive mask). However, in general, it may also be of a reflective type, for example (with a reflective mask). Alternatively, the apparatus may employ another kind of patterning structure, such as a programmable mirror array of a type as referred to above.

The source LA (e.g. a mercury lamp, a UV excimer laser, an electron gun, a laser-produced plasma source or discharge plasma source, or an undulator or wiggler provided around the path of an electron beam in a storage ring or synchrotron) produces a beam of radiation. This beam is fed into an illumination system (illuminator) IL, either directly or after having traversed a conditioning structure or field, such as a beam expander Ex, for example. The illuminator IL may comprise an adjusting structure or field AM for setting the outer and/or inner radial extent (commonly referred to as σ-outer and σ-inner, respectively) of the intensity distribution in the beam, which may affect the angular distribution of the radiation energy delivered by the projection beam at, for example, the substrate. In addition, the apparatus will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but it may also be remote from the lithographic projection apparatus, the radiation beam which it produces being led into the apparatus (e.g. with the aid of suitable direction mirrors). This latter scenario is often the case when the source LA is an excimer laser. The current invention and claims encompass both of these scenarios.

The beam PB subsequently intercepts the mask MA, which is held on a mask table MT. Having traversed (alternatively, having been selectively reflected by) the mask MA, the beam PB passes through the lens PL, which focuses the beam PB onto a target portion C of the substrate W. With the aid of the second positioning structure (and interferometric measuring structure IF), the substrate table WT can be moved accurately, e.g. so as to position different target portions C in the path of the beam PB. Similarly, the first positioning structure can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks and substrate alignment marks.

The depicted apparatus can be used in two different modes:

1. In step mode, the mask table MT is kept essentially stationary, and an entire mask image is projected at once (i.e. in a single "flash") onto a target portion C. The substrate table WT is then shifted in the x and/or y directions so that a different target portion C can be irradiated by the beam PB;

2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image. Concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

To enable a measurement of aberrations, a particular mask may include test patterns. Generally, standard alignment marks having equal lines/spaces along the x- and y-directions (as shown in FIG. 1, e.g. with a line width of 8 μm for the imaged mark) and special, asymmetrically segmented alignment markers are used as test patterns. The lateral position (i.e. the position in the x,y plane shown in FIG. 1, also referred to as 'the horizontal position' hereinafter) and best focus position (i.e. the position along the z direction in FIG. 1, also referred to as 'the vertical position' hereinafter) of aerial images of test patterns can be measured with one or more transmission image sensors TIS. An example of a transmission image sensor is described in greater detail in U.S. Pat. No. 4,540,277, which document is incorporated herein by reference.

A transmission image sensor TIS is set into a physical reference surface associated with the substrate table WT. In one example, two sensors are mounted on a fiducial plate that is mounted to the top surface of the substrate table WT, the sensors being located at diagonally opposite positions outside the area covered by the wafer W. The fiducial plate is made of a highly stable material with a very low coefficient of thermal expansion (e.g. Invar) and has a flat reflective upper surface that may carry markers used with another fiducial in alignment processes.

The transmission image sensor or sensors TIS are used to determine directly the vertical and horizontal position of the aerial image, as projected by the projection lens, of a test pattern on the mask. Such a sensor includes one or more apertures in the reflective surface, and one or more photodetectors placed close behind the apertures that is sensitive to the radiation used for the exposure process. In particular, the sensor may have slit-shaped apertures with slits parallel to the x and/or y direction in FIG. 1. In general, a specific test pattern is used in combination with a specific, corresponding aperture shape and/or arrangement of a transmission image sensor TIS.

To determine the position of the focal plane, the projection lens projects into space an image of a test pattern having contrasting light and dark regions that is provided on the mask MA. The substrate stage is then scanned horizontally (in one or preferably two directions) and vertically so that a corresponding aperture or apertures of the transmission image sensor TIS passes through the space where the aerial image is expected to be. As an aperture passes through the light and dark portions of the image of the test pattern, the output of a corresponding photodetector will fluctuate (a Moiré effect). The vertical level at which the rate of change of amplitude of the photodetector output is highest indicates the level at which the image of a test pattern has the greatest contrast and hence indicates the plane of optimum focus. The horizontal position at which the rate of change is highest indicates the aerial image's lateral position. Because such use of a transmission image sensor is a direct measurement technique not involving exposure of a resist, advantages may include robustness and speed.

In a method according to an embodiment of the invention, a test pattern suitable for measuring low-order aberrations and higher-order aberrations (such as three-wave aberration) is considered. The presence of three-wave aberration is particularly detrimental for the fidelity of a projected image of a pattern with a so-called "brick wall" structure. In a brick wall structure, rectangular-shaped isolated areas are arrayed like bricks in a brick wall. Consequently, in a method according to an embodiment of the invention, a test pattern featuring a repeating, two-dimensional structure in accordance with a brick wall geometry can be used for improving the accuracy of a measurement of this specific higher-order aberration.

Figure 2:
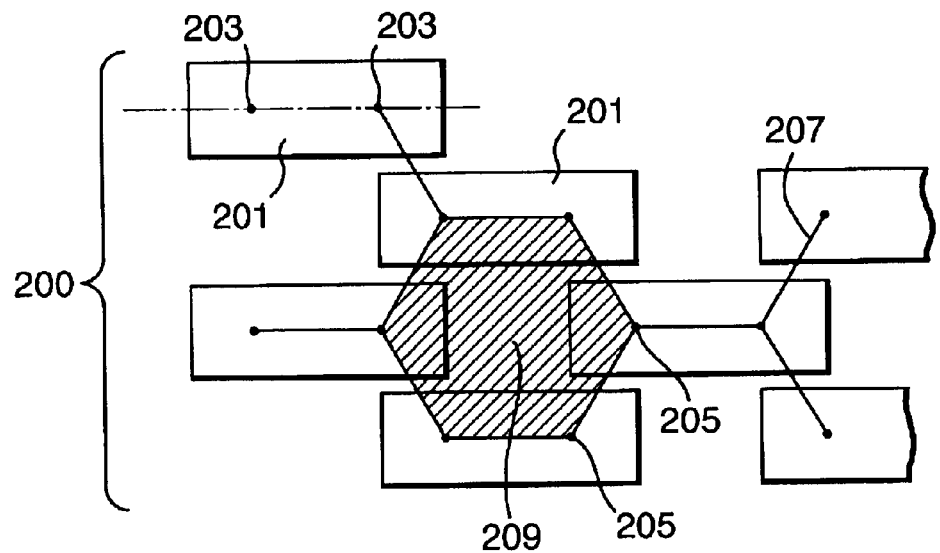
FIG. 2 depicts a so-called "brick wall" pattern and a corresponding lattice with hexagonal unit cells.

FIG. 2 illustrates the characteristic structure of a (two-dimensional) brick wall 200. The position of each elongated rectangular-shaped isolated area representing a (two-dimensional) brick 201 can be defined by the position of two points 203, each point located on the long axis of symmetry of a brick 201 and at a fixed distance from a corresponding end face of said brick 201. The points 203 of the bricks 201 coincide with the lattice points 205 of a lattice 207. The lattice 207 is characterised by a hexagonal unit cell 209. Such a lattice is referred to as a honeycomb lattice (or 'HC-lattice') hereinafter, and a test pattern with isolated areas positioned at or near the lattice points 205 will be referred to as a honeycomb pattern (or 'HC-pattern').

Figure 3:
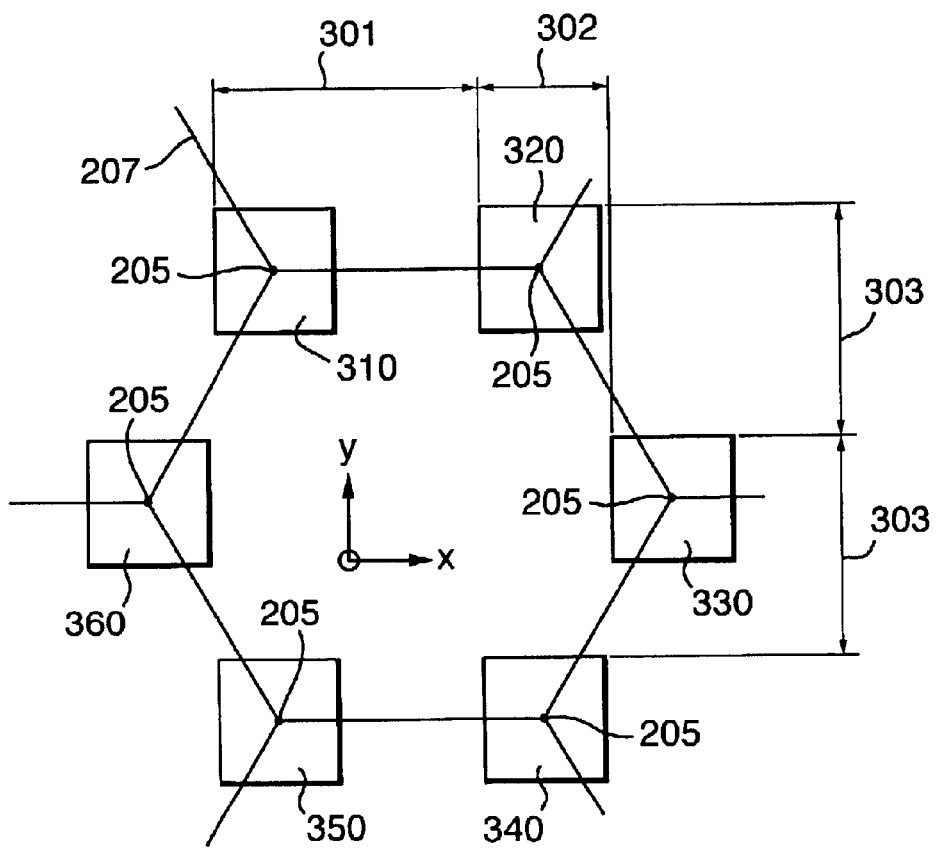
FIG. 3 depicts an example of a layout of isolated areas in a hexagonal unit cell.

FIG. 3 shows a typical layout of a unit cell of a HC-pattern. The isolated areas 310, 320, 330, 340, 350 and 360 of the unit cell of the HC-pattern are substantially centered at points 205 of a hexagonal lattice 207. In the case of a mask the HC-pattern can be embodied as, for example, substantially transmissive square areas surrounded by a radiation blocking layer (such as, for example, a chrome layer) on a surface of a reticle. In one exemplary embodiment, the separations 301, 302, and 303 have lengths 400 nm, 200 nm, and 350 nm, respectively.

Figure 4:
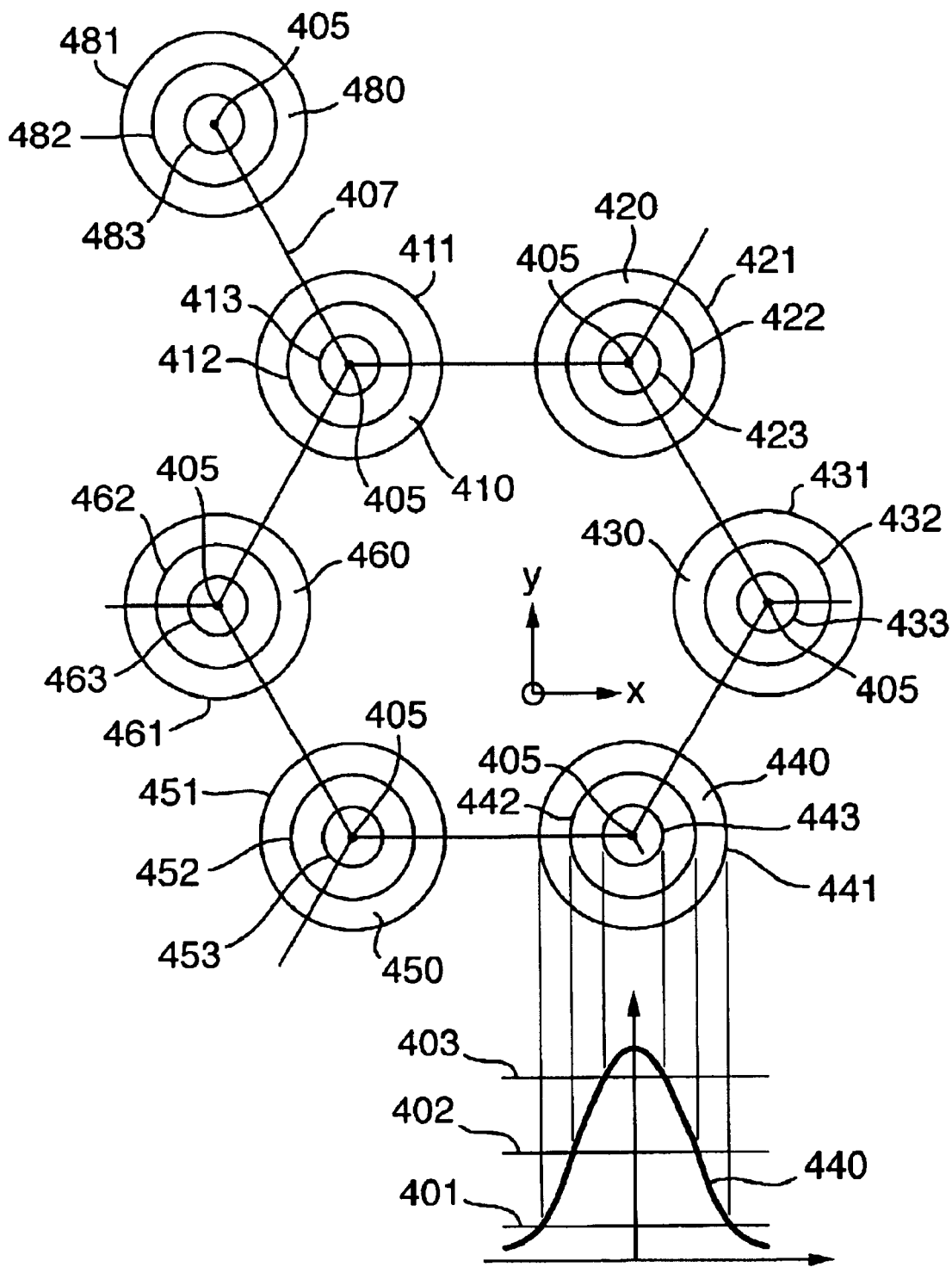
FIG. 4 illustrates an intensity distribution of a projected image of a test pattern of isolated areas, corresponding to a lattice of hexagonal unit cells (as illustrated in FIG. 3), in the absence of residual aberration. A plot of a local intensity distribution is shown; along the vertical axis is the intensity of the projection beam radiation as a function of position along a line in the x-direction, traversing a lattice point.

A projected image of such a HC-pattern is shown schematically in FIG. 4 for a unit cell and an isolated area of a neighbouring unit cell. In this image, the presence of isolated areas 310, 320, 330, 340, 350 and 360 of a unit cell of the HC-pattern is apparent through corresponding intensity distributions 410, 420, 430, 440, 450 and 460 at or near the points 405 of a corresponding hexagonal lattice 407. The intensity distribution 480 in FIG. 4 is an image of a corresponding isolated area of a neighbouring unit cell in the test pattern; other such intensity distributions are (for simplicity) not shown in FIG. 4. To distinguish the intensity distribution of an image of the HC-pattern as a whole from an intensity distribution of an image of a single isolated area (such as, for example, the intensity distribution 440), the latter intensity distributions may be referred to hereinafter as "local" intensity distributions.

FIG. 4 shows a plot of a local intensity distribution for the intensity distribution 440. Plotted along the vertical axis is the intensity of the projection beam radiation as a function of position along a line in the x-direction, traversing the lattice point 405 comprised by the intensity distribution 440. The set of intensity contour lines 441, 442, and 443 in FIG. 4 represent lines of equal local intensity (respectively, intensities 401, 402 and 403). These intensities are similarly represented by the sets of intensity contour lines (411, 412, 413), (421, 422, 423), (431, 432, 433), (451, 452, 453), (461, 462, 463) and (481, 482, 483) that characterize the local intensity distributions 410, 420, 430, 450, 460, and 480, respectively.

In the absence of aberrations, such properties of an image of an isolated area as, for example, the peak intensity of local intensity distributions are substantially equal. This situation is shown in FIG. 4. Generally, in the presence of residual aberration, said properties of images of isolated areas are mutually different. For example, in the presence of x three-wave aberration, the peak intensity of the intensity distributions 410, 430 and 450 differs from the peak intensity of the intensity distributions 420, 440, 460 and 480.

Figure 5:
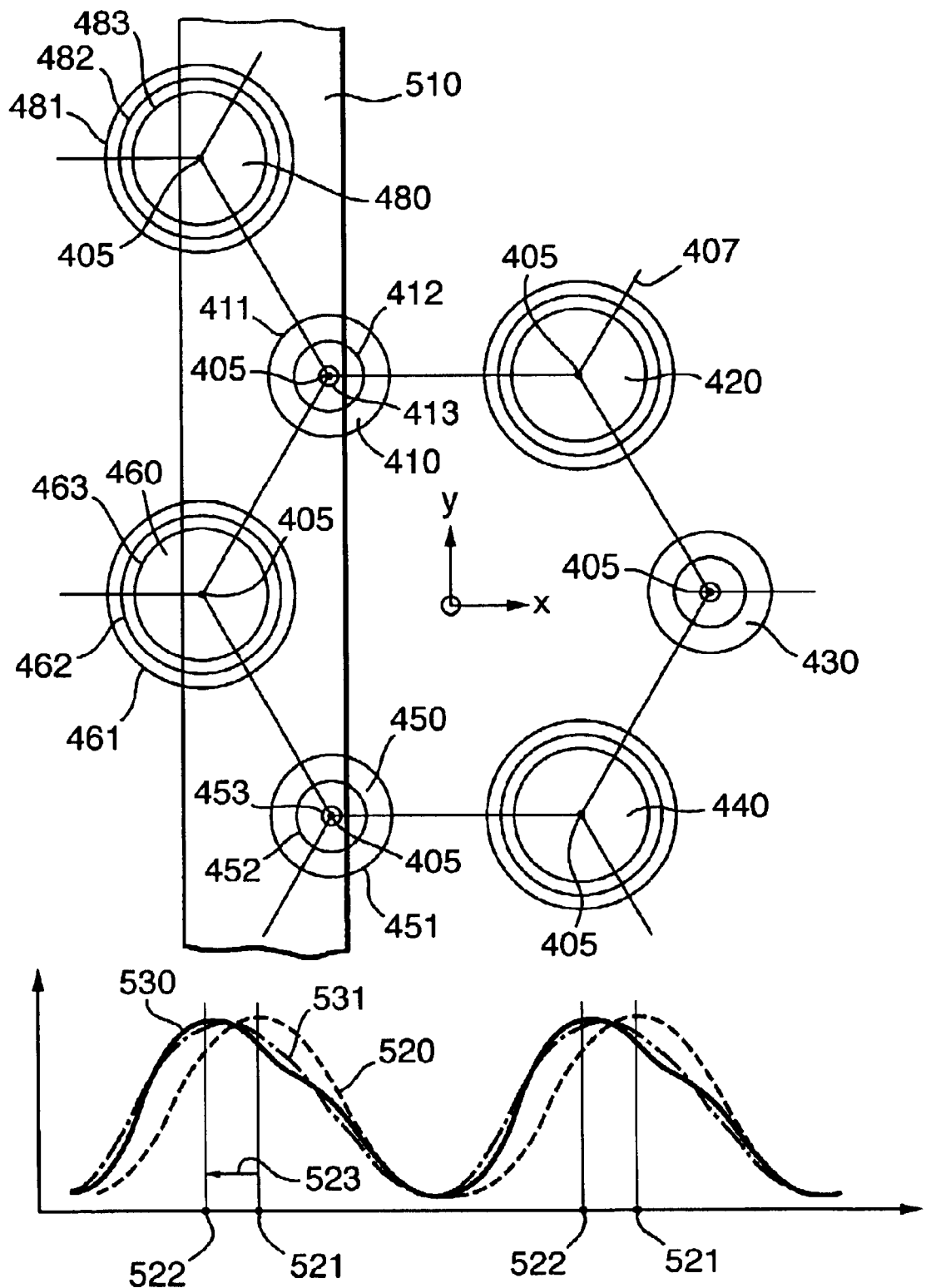
FIG. 5 illustrates an intensity distribution of a projected image of a test pattern in the presence of three-wave aberration. The graph shows, along the vertical axis, a detected signal as measured with a slit-shaped radiation detector, and along the horizontal axis a lateral position of the slit-shaped radiation detector.

FIG. 5 illustrates this effect. For example, the intensity contour lines 461, 462, 463 and 481, 482, 483 of local intensity distributions 460 and 480, respectively, are displaced radially outwards from the corresponding lattice points 405 with respect to their positions in FIG. 4, indicating an increase of peak intensity. Similarly, the contour lines 411, 412, 413 and 451, 452, 453 of local intensity distributions 410 and 450, respectively, are displaced radially inwards, indicating a decrease of peak intensity.

The effect shown in FIG. 5 can be measured by scanning (in the x direction in FIG. 5) the intensity distribution of the image of the test pattern with a slit-shaped aperture 510 of the TIS (with the slit parallel to the y axis in FIG. 5). The vertical axis of the graph in FIG. 5 indicates the intensity detected by the TIS as a function of position of the slit along the x direction. In the absence of residual aberration, the detected intensity 520 is a periodically varying function of x, with peak values occurring at slit x-positions 521. The presence of x three-wave aberration leads to a (phase) shifted periodically varying intensity signal 530, with peak values occurring at slit x-positions 522.

Figure 6:
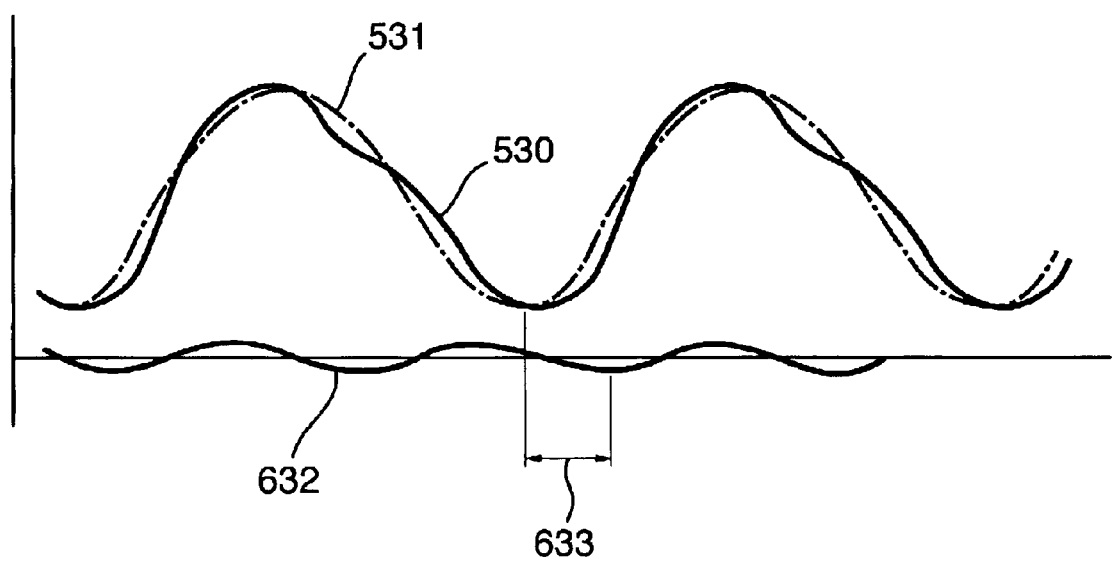
FIG. 6 shows a decomposition of the detected signal into a harmonic signal and a first higher-order harmonic signal. Along the vertical axis the signals are plotted, and along the horizontal axis a lateral position of the slit-shaped radiation detector is plotted.

A method according to an embodiment of the invention includes performing a real-time, direct measurement of an aerial image formed by the projection system to obtain values for one or more parameters. One measurable parameter of the image of the test pattern (representative of x three-wave aberration) is, for example, the position shift indicated by the arrow 523 in FIG. 5. Methods according to embodiments of the invention are not limited to this parameter, however. For example, from the detected signal 530 a best-fit sinusoidally varying function 531 can be determined, and the phase shift between the signals 520 and 531 can be measured. Alternatively, as illustrated in FIG. 6, the detected signal 530 can be decomposed into the best-fit sinusoidally varying function 531 and a first higher-order harmonic signal 632. The phase shift 633 of the signal 632 is also a measurable parameter representative of x three-wave aberration.

The direct measurement of an aerial image may be performed for a plurality of different settings of the radiation system and/or the projection system (for example, a plurality of different σ-NA settings). Preferably, at least one parameter represents a difference between a value of a characteristic of a projected image of one isolated area within a unit cell and a value of the same characteristic of a projected image of each of at least one other isolated area within the unit cell. The characteristic may be selected from the group comprising peak intensity, spatially integrated intensity, spatial intensity distribution, the shape of an image cross section and the size of an image cross section, for example. The availability of a parameter representing the difference enables measurement of a larger number of aberration coefficients when compared with TAMIS, for example, in combination with the use of grating segments as test patterns.

In one example, a plurality of parameters are measured at a corresponding plurality of different numerical aperture settings of the projection system and/or different settings of pupil filling at a pupil plane in the radiation system. These different settings of pupil filling may include different illumination modes selected from the group comprising disc-shaped, annular, quadrupolar, dipolar and soft-multipolar illumination mode, for example. For more information on the definition and realization of illumination modes, see for example U.S. patent application Ser. No. 09/287,014, which document is incorporated herein by reference.

Alternatively, the parameter or parameters measured may include the position of best focus and/or the lateral position of a projected image of the test pattern.

In a method according to another embodiment of the invention, Zernike aberration coefficients (also referred to as 'Zernike coefficients') are measured (possibly in addition to other parameters as described herein). These coefficients, which represent aberrations of a projection system, describe in particular the projection lens wavefront aberrations. The wavefront aberration W can be written as a series called a Zernike expansion according to the angular form:

$$W = Z_i f_i(r, \theta) + Z_j f_j(r, \theta) + Z_k f_k(r, \theta) + \ldots \quad (1)$$

where each Z is a Zernike coefficient and each $f$ is the corresponding Zernike polynomial, and where r and $\theta$ are radial and angular co-ordinates, respectively. Here, r is normalized by the radius of the pupil of the projection system. The functions $f$ take the form of the product of a polynomial in r and in sin or cos of $m\theta$. The table shown in FIG. 7 lists the Zernike coefficient (in column 1), the corresponding Zernike polynomial (in column 2), the so-called "order" of the aberration (in column 3), and a name of the aberration (in column 4). Column 5 is used for reference below.

According to the TAMIS method, parameters which can be used to measure Zernike aberration coefficients include the position of best focus and the lateral position of the image of the test pattern as a whole. Parameters relating to differences between local intensity distributions (for example, those mentioned herein) can be used as well. Any of the parameters is preferably measured for a plurality of different σ-NA settings. The relation between measured parameters and Zernike aberration coefficients can be expressed in the following way:

$$P_{meas} = \overline{\overline{Scalc}} Z \quad (2)$$

Here, the components of the vector Pmeas may be any of the parameters as measured, at any desired σ-NA settings. Further, the components of the vector Z are the Zernike aberration coefficients which are to be measured, and the elements of the matrix $\overline{\overline{Scalc}}$ are calculated sensitivity coefficients which, in linear approximation, relate the value of a Zernike aberration to the value of a parameter as measured. With a HC-pattern as partly shown in FIG. 3, for example, the vector Z may contain the Zernike aberration coefficients marked "hc x" in the Table shown in FIG. 7. A supplementary HC-pattern, rotated 90 degrees in the x,y plane of FIG. 3, can be used to measure the Zernike aberrations marked "hc y" in the Table shown in FIG. 7. When the use of two mutually orthogonal HC-patterns is needed to calculate a single aberration coefficient from the measurement data, this is indicated by "hc x,y" in column 5 of the Table shown in FIG. 7. By inverting Equation (2), the Zernike aberration coefficients can be calculated from the measured data.

Figure 8:
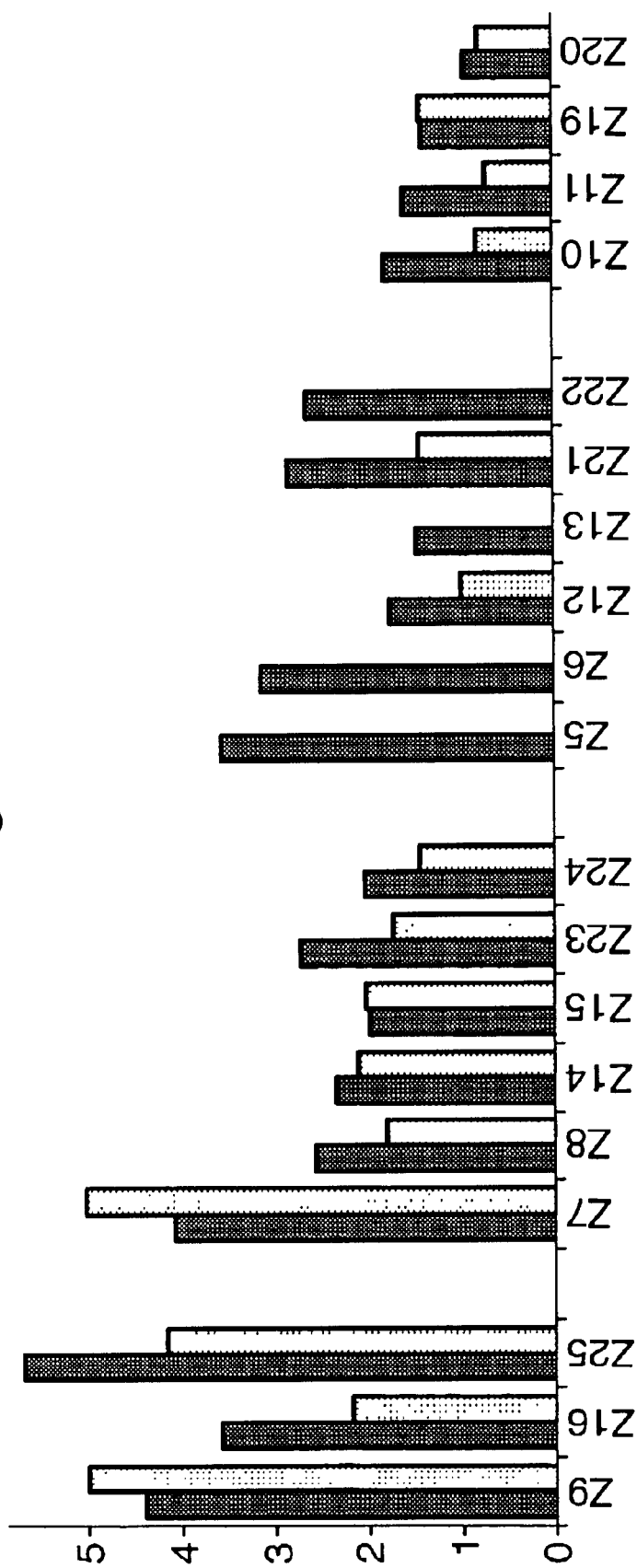
FIG. 8 illustrates a correlation between measurement results for aberrations as measured with ARTEMIS, with a shearing interferometer, and with the present method. Along the vertical axis, a root mean square value in nm of a difference between measurement results is plotted.

Confirmation of the usefulness of the technique of the present invention is illustrated in FIG. 8. For a specific projection system of a lithographic projection apparatus operated at a wavelength of 248 nm, and featuring a maximum NA of 0.75, the values of Zernike coefficients were measured by the lens manufacturer at a set of 13 different positions along the x direction in an image field (corresponding to a target portion C), using a technique referred to hereafter as SIF (a through-the-lens Shearing InterFerometry method developed by the manufacturer). The reference measurement results obtained with SIF are compared with Zernike aberrations as measured using ARTEMIS and as measured using a method according to an embodiment of the invention. As a result, for each of the latter two methods, 13 difference values (corresponding to the set of 13 different positions) are obtained for each Zernike coefficient.

In FIG. 8, the root-mean-square values of the 13 difference values (in nm) are plotted along the vertical axis for a number of different Zernike aberration coefficients. The solid black bars represent the results obtained with ARTEMIS, while the shaded bars represent the results obtained with the method according to an embodiment of the invention, using a HC-pattern (referred to as 'HC-TAMIS' hereinafter). FIG. 8 shows that the correlation of the HC-TAMIS measurement results with the SIF measurement results is comparable with, or even better than, the correlation of the ARTEMIS measurement results with the SIF measurement results. The improvement over ARTEMIS is especially substantial for the measurement of the x three-wave and y three-wave aberration coefficients Z10 and Z11, respectively.

A method according to one embodiment of the invention includes calculating a theoretical variation of one or more of the measured parameters as a function of a small change in one or more coefficients representative of aberration of the projection system. Such calculating may be performed for each of the different illumination settings. Subsequently, one can calculate the one or more coefficients by multiple regression or a least-square fit of a set of simultaneous equations. In particular, Zernike aberration coefficients can be obtained.

Generally, a test pattern for use in a method or apparatus according to an embodiment of the invention includes a two-dimensional lattice of isolated areas that contrast with a remainder of the area of the test pattern, where the unit cell of the lattice comprises at least three isolated areas. Here, the verb "contrast" refers to being sufficiently different so as to have a patterning effect on radiation of the projection beam. For example, contrasting isolated areas may be embodied as opaque or reflecting chromium areas on a surface of a substantially transparent reticle, or as substantially transmissive areas in a radiation blocking or reflecting chromium coating covering a reticle surface. Also, in analogy with attenuated phase shift masks, the transmittance and/or the phase shifting properties of isolated areas may substantially differ from the transmittance and/or the phase shifting property of an area comprising said isolated areas, for example (i.e. differ sufficiently so as to have a patterning effect on radiation of the projection beam).

A pattern representative of an individual layer of a device may comprise a repeating two-dimensional structure of features positioned in accordance with a two-dimensional lattice in a plane comprising the pattern. The inventors have discovered that the fidelity of a projected (aerial) image of such a pattern generally strongly depends on the presence of specific higher-order aberrations. Consequently, a test pattern that features a repeating two-dimensional structure of isolated areas positioned in accordance with the two-dimensional lattice is particularly suited for measurement of said specific higher-order aberrations.

For example, a test pattern featuring isolated areas positioned in accordance with a lattice, wherein said unit cell of said lattice is a hexagonal cell comprising six isolated areas positioned at or near the six corners of the hexagonal cell, may be used for obtaining good sensitivity to (higher-order) three-wave aberration.

Generally, in order to obtain a desired sensitivity to specific, different types of higher-order aberrations, said unit cell of said lattice may have a shape selected from the group of shapes comprising triangular shape, quadrangular shape and hexagonal shape. Said isolated areas are not necessarily located at the corners of a unit cell. They may also be located along the sides of a unit cell, or both at the corners and along the sides of a unit cell, or within a unit cell.

Methods according to embodiments of the invention are not limited to the use of HC-patterns. In a method according to a further embodiment, which may be the same as a method according to another embodiment save as described below, a test pattern comprising a two-dimensional lattice of isolated areas is used in which the unit cell has a quadrangular shape. Such a test pattern is sensitive, for example, to the presence of x and y four-wave aberration.

Figure 9:
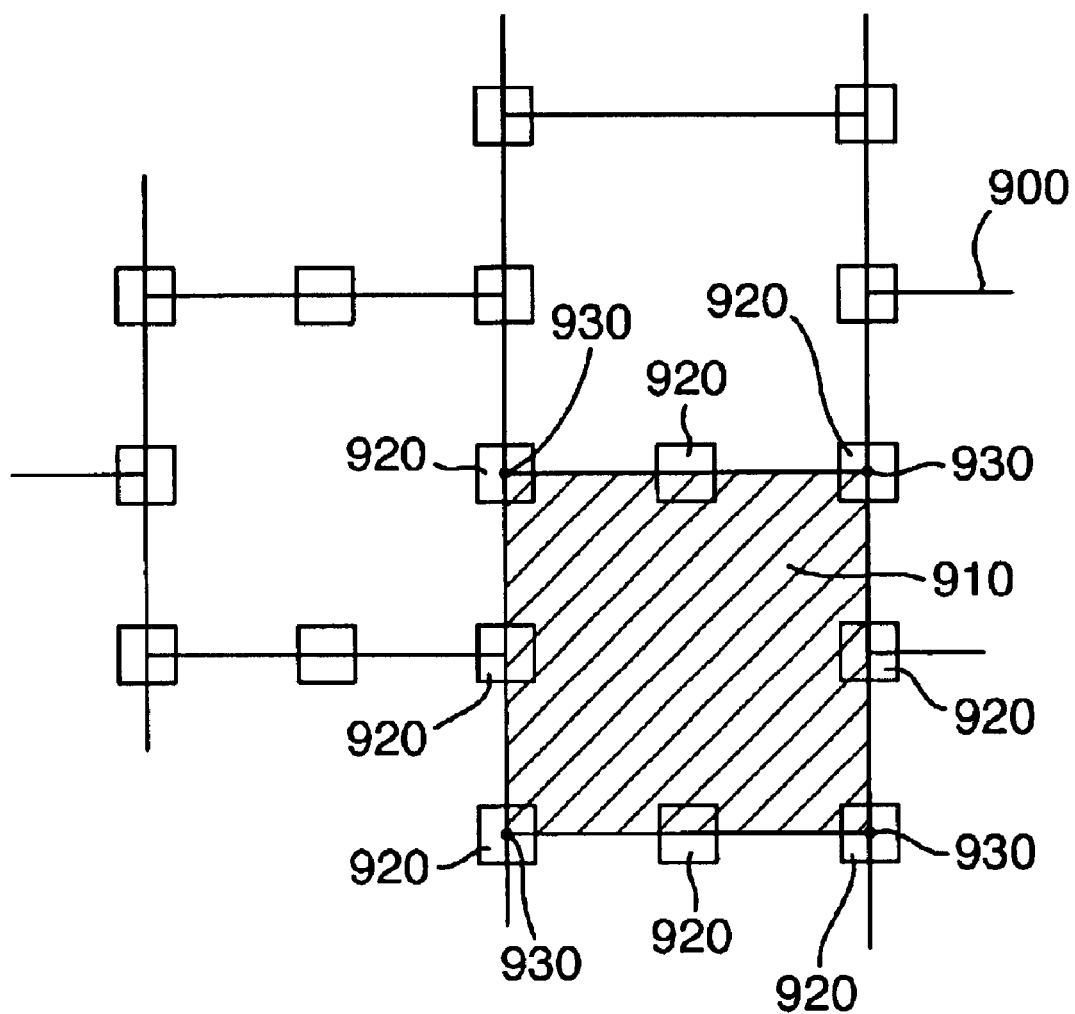
FIG. 9 shows a test pattern with isolated areas, corresponding to a lattice with quadrangular unit cells.

A test pattern characterized by a lattice of arrayed quadrangular unit cells may have isolated areas at or near the corners of the lattice, but is not limited to such a layout. FIG. 9 shows an example of a test pattern matched to a lattice 900 featuring a quadrangular unit cell 910 with eight isolated areas 920 (four of which are located at or near the corners 930 of the unit cell). The use of such a test pattern supports enhanced sensitivity to both three- and four-wave aberration.

Generally, test patterns with triangular, quadrangular and hexagonal shaped unit cells can be used, depending on the desired sensitivity to specific aberrations. Alternatively, for measuring x and y coma, and x and 45° astigmatism, for example, test patterns comprising a segment of a grating with periodic lines and spaces, and/or a repeating structure of parallel, line-shaped isolated areas, can be used. Preferably, a test pattern for measuring aberrations comprises a plurality of different constituent test patterns such as mentioned here, for example.

In a further embodiment of the invention, the test pattern includes, in addition to isolated areas positioned in accordance with a lattice, at least one supplementary test pattern for measuring aberrations such as, for example, x astigmatism and 45° astigmatism. Such a supplementary test pattern may be a two-dimensional structure that includes a segment of a grating with periodic lines and spaces, or a two-dimensional structure that includes a repeating structure of parallel, line-shaped isolated areas.

In a method according to a further embodiment of the invention, real-time, direct measurement of at least one parameter of an aerial image of the test pattern is performed using radiation detection means that includes a transmissivity-patterned radiation aperture. The transmissivity-patterned radiation aperture comprises a two-dimensional lattice of isolated areas, each isolated area having a transmissivity that is substantially different from the transmissivity of an area of said radiation aperture comprising said isolated areas. The positions of isolated areas of the radiation aperture with respect to each other can be matched to positions of isolated areas of said test pattern, taking into account the magnification factor M of the projection system. The use of such a radiation aperture for scanning a projected image of said test pattern and measuring aberrations may result in enhanced sensitivity in comparison with the use of a slit-shaped radiation aperture.

In a method according to a further embodiment, which may be the same as a method according to another embodiment save as described below, the image sensor TIS includes a radiation aperture featuring a two-dimensional lattice of isolated, substantially transmissive areas in the reflective upper surface of the fiducial plate. In some applications of such a method, the sensitivity of the detected signal to the presence of aberrations may be enhanced as compared to a sensitivity obtained using a slit-shaped aperture.

For example, in combination with a HC-pattern for use as a test pattern, a radiation aperture comprising a hexagonal array of isolated apertures (referred to hereinafter, for simplicity, as "sub-apertures") can be used. For example, the shape of the sub-apertures may be circular or rectangular. In some applications, the particular shape of the sub-apertures may not be a critical parameter. The positions of the sub-apertures with respect to each other, in said reflective upper surface of the fiducial plate, may be matched to positions of isolated areas of said HC-pattern, taking into account the magnification factor M of the projection system, such that a match with positions of images of isolated areas of the HC-test pattern can be obtained when the test pattern is in alignment with the radiation aperture.

The area of the radiation aperture comprising said sub-apertures may, for example, be slit-shaped, as described above in connection with a method according to the first embodiment. Scanning a projected image of the HC-pattern with a slit-shaped radiation aperture that includes such sub-apertures may provide an enhancement of a result as indicated in the graphs 530 in FIG. 5, such as enhanced modulation of the detected signal as a function of scan position of the radiation aperture and an enhanced effect of aberrations on the detected signal.

Alternatively, the sensor may include two separate radiation apertures, each comprising sub-apertures positioned in accordance with a two-dimensional lattice, and each radiation aperture providing radiation to a corresponding, separate radiation detector. For example, the sub-apertures of one radiation aperture can be positioned in accordance with a lattice featuring a triangular unit cell such that a match occurs (in alignment, as described above) with the positions of the intensity distributions 410, 430 and 450 in FIG. 4. Similarly, the sub-apertures of the other radiation aperture can be embodied such as to match (in alignment) with the positions of the intensity distributions 420, 440 and 460 in FIG. 4. Such a dual aperture layout may provide enhanced sensitivity to aberration-induced lateral displacements of the intensity distributions 410, 430 and 450 with respect to the intensity distributions 420, 440 and 460 in FIG. 4.

Therefore, methods according to embodiments of the invention are not limited to the example of the HC-pattern or to the scheme of matching sub-apertures to desired, specific isolated areas of a hexagonal unit cell of the test pattern. In a similar way, one or more radiation detection apertures comprising sub-apertures can be embodied for use with test patterns in accordance with lattices featuring triangular and quadrangular unit cells. Also, a method according to an embodiment of the invention may include any desired scheme of matching sub-apertures to desired, specific isolated areas of a unit cell of a test pattern, as described in the example above.

Whilst specific embodiments of the invention have been described above, it will be appreciated that the invention as claimed may be practiced otherwise than as described. It is explicitly noted that the description of these embodiments is not intended to limit the invention as claimed.

I claim:

1. A method of determining aberration of a projection system, said method comprising:

supplying a projection beam of radiation;

using a test pattern to pattern the projection beam;

using the projection system to project the patterned beam;

at each of a plurality of different illumination settings, directly measuring an aerial image of the test pattern as formed by the projection system to obtain a corresponding value of each of at least one parameter; and based on the corresponding values, calculating at least one coefficient relating to aberration of the projection system, wherein the test pattern includes a two-dimensional lattice comprising a plurality of unit cells, each unit cell including at least three isolated areas, and wherein at least one of a transmissivity, a reflectivity, and a phase-shifting property of the isolated areas is substantially different from that of a remainder of the area of the unit cell.

2. The method of determining aberration of a projection system according to claim 1, wherein each unit cell has the shape of a hexagon and includes six isolated areas, each isolated area being positioned at or near a corresponding one of the six corners of the hexagon.

3. The method of determining aberration of a projection system according to claim 1, wherein each unit cell has a shape selected from the group consisting of a triangle, a quadrangle, and a hexagon.

4. The method of determining aberration of a projection system according to claim 1, wherein the at least one parameter includes a difference between a value of a characteristic of an image of an isolated area of a unit cell and a value of the same characteristic of an image of each of at least one other isolated area of the unit cell.

5. The method of determining aberration of a projection system according to claim 4, wherein the characteristic is selected from the group consisting of peak intensity, spatially integrated intensity, spatial intensity distribution, a shape of a cross section of the image of the isolated area, and a size of a cross section of the image of the isolated area.

6. The method of determining aberration of a projection system according to claim 1, wherein said directly measuring is performed using radiation detection means comprising a plurality of radiation apertures, wherein the radiation apertures are arrayed in a two-dimensional matrix pattern.

7. The method of determining aberration of a projection system according to claim 1, wherein said plurality of different illumination settings includes a plurality of different numerical aperture settings.

8. The method of determining aberration of a projection system according to claim 1, wherein said plurality of different illumination settings includes a plurality of different settings of at least one of the outer and the inner radial extent of the intensity distribution of the projection beam.

9. The method of determining aberration of a projection system according to claim 1, wherein said plurality of different illumination settings includes a plurality of different illumination modes selected from the group consisting of disc-shaped, annular, quadrupolar, dipolar and soft-multipolar illumination mode.

10. The method of determining aberration of a projection system according to claim 1, wherein said at least one parameter includes at least one of (1) a position of best focus of the aerial image of the test pattern and (2) a lateral position of the aerial image of the test pattern.

11. The method of determining aberration of a projection system according to claim 1, further comprising calculating a variation of at least one of the at least one parameter as a function of a change in at least one of the at least one coefficient.

12. The method of determining aberration of a projection system according to claim 1, wherein said calculating at least one coefficient includes using at least one of multiple regression and a least-square fit of a set of simultaneous equations.

13. The method of determining aberration of a projection system according to claim 1, wherein the at least one coefficient is a Zernike coefficient.

14. The method of determining aberration of a projection system according to claim 1, wherein the test pattern further includes at least one supplementary test pattern having a structure different than the two-dimensional lattice.

15. The method of determining aberration of a projection system according to claim 14, wherein the at least one supplementary test pattern is selected from the group of two-dimensional pattern structures consisting of (1) a segment of a grating with periodic lines and spaces and (2) a repeating structure of parallel, line-shaped isolated areas.

16. A method of manufacturing a device, said method comprising:

supplying a projection beam of radiation;

using a test pattern to pattern the projection beam;

using the projection system to project the beam patterned using the test pattern;

at each of a plurality of different illumination settings, directly measuring an aerial image of the test pattern as formed by the projection system to obtain a corresponding value of each of at least one parameter;

based on the corresponding values, calculating at least one coefficient relating to aberration of the projection system;

using a patterning structure to pattern the projection beam; and using a projection system to project the beam patterned using the patterning structure onto a target portion of a layer of radiation-sensitive material that at least partially covers a substrate, wherein said using a projection system to project the beam patterned using the patterning structure includes, based on the at least one coefficient, correcting for aberration of the projection system, and wherein the test pattern includes a two-dimensional lattice comprising a plurality of unit cells, each unit cell including at least three isolated areas, and wherein at least one of a transmissivity, a reflectivity, and a phase-shifting property of the isolated areas is substantially different from that of a remainder of the area of the unit cell.

17. The method of manufacturing a device according to claim 16, wherein each unit cell has a shape selected from the group consisting of a triangle, a quadrangle, and a hexagon.

18. The method of manufacturing a device according to claim 16, wherein said directly measuring is performed using radiation detection means comprising a plurality of radiation apertures, wherein the radiation apertures are arrayed in a two-dimensional matrix pattern.

19. A device manufactured in accordance with the method of claim 16.

20. A method of determining aberration of a projection system, said method comprising:

supplying a projection beam of radiation;

using a test pattern to pattern the projection beam;

using the projection system to project the patterned beam;

directly measuring an aerial image of the test pattern as formed by the projection system to obtain a corresponding value of each of at least one parameter; and based on the at least one corresponding value, calculating at least one coefficient relating to aberration of the projection system, wherein the test pattern includes a two-dimensional lattice comprising a plurality of unit cells, each unit cell including at least three isolated areas, and wherein at least one of a transmissivity, a reflectivity, and a phase-shifting property of the isolated areas is substantially different from that of a remainder of the area of the unit cell.

21. The method of determining aberration of a projection system according to claim 20, wherein each unit cell has a shape selected from the group consisting of a triangle, a quadrangle, and a hexagon.

22. The method of determining aberration of a projection system according to claim 20, wherein said directly measuring is performed using radiation detection means comprising a plurality of radiation apertures, wherein the radiation apertures are arrayed in a two-dimensional matrix pattern.

* * * * *